United States Patent
Bierhuizen et al.

(10) Patent No.: US 8,129,735 B2
(45) Date of Patent: Mar. 6, 2012

(54) LED WITH CONTROLLED ANGULAR NON-UNIFORMITY

(75) Inventors: Serge J. Bierhuizen, Santa Rosa, CA (US); Willem Sillevis Smitt, San Jose, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 144 days.

(21) Appl. No.: 12/236,527

(22) Filed: Sep. 24, 2008

(65) Prior Publication Data

US 2010/0072488 A1    Mar. 25, 2010

(51) Int. Cl.
*H01L 33/00* (2010.01)
(52) U.S. Cl. ............... 257/98; 257/79; 257/E33.068
(58) Field of Classification Search ............ 257/79, 257/98, E33.068
See application file for complete search history.

(56) References Cited

U.S. PATENT DOCUMENTS

| 2006/0063289 A1* | 3/2006 | Negley et al. ............ 438/26 |
| 2007/0152230 A1* | 7/2007 | Duong et al. ............ 257/98 |
| 2007/0284592 A1* | 12/2007 | Haase ............ 257/79 |

FOREIGN PATENT DOCUMENTS
EP    1178544 A2    6/2002

OTHER PUBLICATIONS
International Search Report, PCT/IB2009/054133.

* cited by examiner

*Primary Examiner* — Zandra Smith
*Assistant Examiner* — Jamie C Niesz

(57) ABSTRACT

A light source that uses a light emitting diode with a wavelength converting element is configured to produce a non-uniform angular color distribution, e.g., Δu'v'>0.015 within an angular distribution from 0° to 90°, that can be used with specific light based device that translate the angular color distribution into a uniform color distribution. The ratio of height and width for the wavelength converting element is selected to produce the desired non-uniform angular color distribution. The use of a controlled angular color non-uniformity in the light source and using it in applications that translate the non-uniformity into a uniform color distribution, e.g., with a uniformity of Δu'v'<0.01, increases the efficiency of the system compared to conventional systems in which a uniform angular light emitting diode is used.

11 Claims, 6 Drawing Sheets

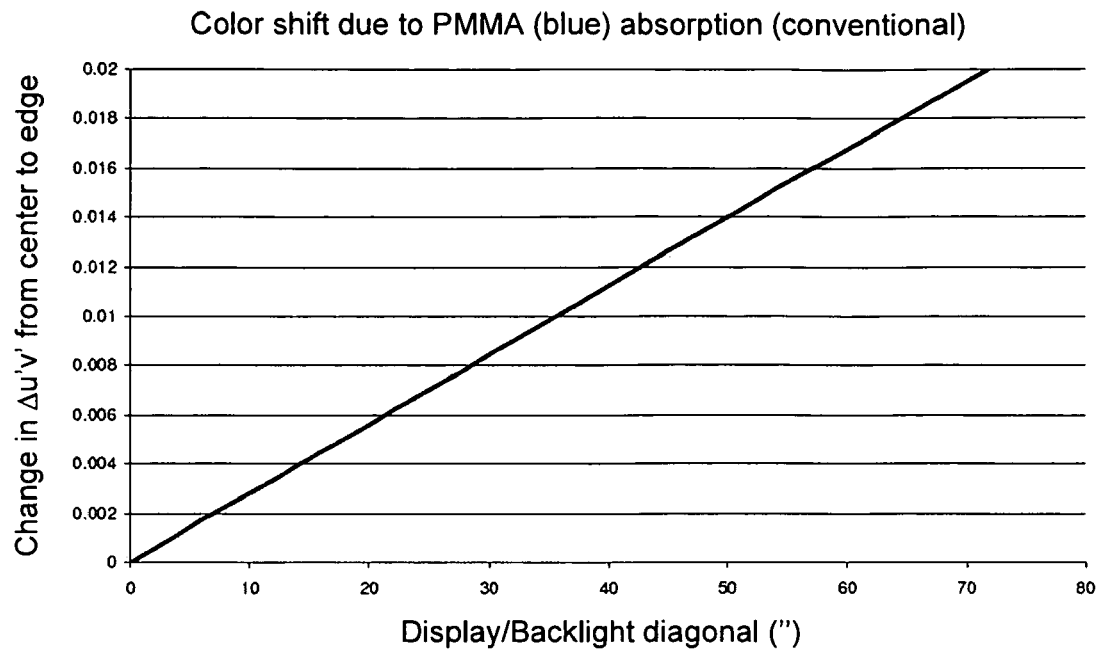
Fig. 9 (Conventional)

LED WITH CONTROLLED ANGULAR NON-UNIFORMITY

FIELD OF THE INVENTION

The present invention is related to light emitting diodes (LEDs) with wavelength conversion and in particular to controlling the angular dependency of an LED to produce a desired non-uniformity.

BACKGROUND

Lighting devices that use light emitting diodes (LEDs) are becoming increasingly common in many lighting applications. Generally, LEDs use phosphor conversion of the primary emission to generate white light, but phosphors can also be used to create more saturated colors like red, green and yellow.

A conventional problem found in phosphor converted LEDs is the uncontrolled angular dependency and color non-uniformity of the light that is produced. Typically light that is emitted from the side of a phosphor layer or light at higher angles from the phosphor layers will have longer wavelengths, i.e., more light is converted, that the light that is emitted from the top of the phosphor layer, as light that is top emitted light is more direct and has less opportunity to be converted by the phosphor. The result is that the color of the emitted light is angularly dependent.

Current strategies for dealing with the color non-uniformity include reducing the angular dependency. By way of example, one strategy is to coat the sides of the phosphor material to prevent the side emission of light. Another strategy is to add scattering particles to the phosphor material to mix the converted and non-converted light so that the side emitted light and top emitted light have approximately the same color. Such solutions to the angular dependency, however, reduce the efficiency of the devices as well as increase the cost of production. Accordingly, other solutions for dealing with the angular dependency are desired.

SUMMARY

A light source includes an LED with a wavelength converting element with a selected ratio of height and width to produce a desired non-uniform angular color distribution, e.g., a uniformity of $\Delta u'v' > 0.015$ within an angular distribution from 0° to 90°. The light source is used with applications that translate the non-uniform angular color distribution from the light source into a uniform color distribution, e.g., with a uniformity of $\Delta u'v' < 0.01$. Consequently, the efficiency of the system is increased relative to conventional systems designed around an LED that is configured to produce a uniform angular color distribution.

BRIEF DESCRIPTION OF THE DRAWINGS

FIG. 9 is a graph illustrating the color shift due to a PMMA waveguide's (blue) absorption over distance.

DETAILED DESCRIPTION

Figure 1:
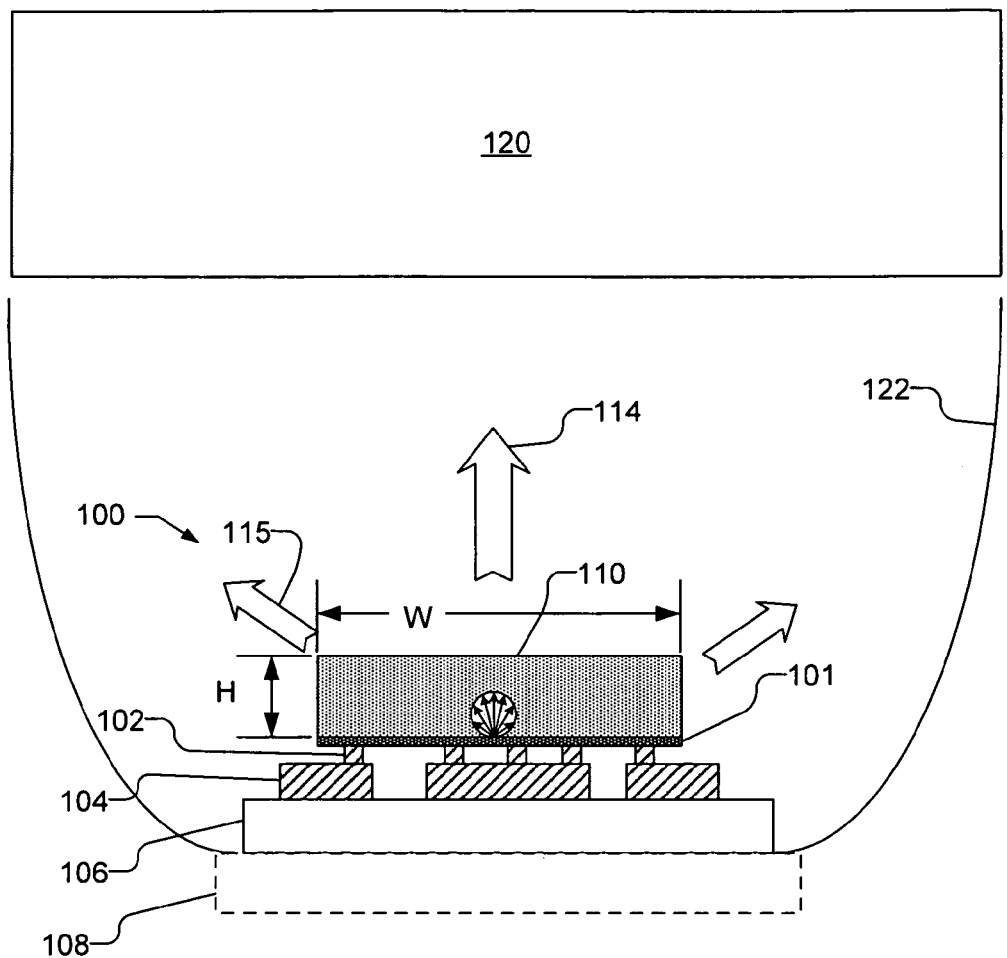
FIG. 1 illustrates a side view of a light source that includes an LED with a wavelength converting element that has a controlled non-uniform angular color distribution.

FIG. 1 illustrates a side view of a light source 100, including a light emitting diode (LED) 101 with a wavelength converting element 110, which has a controlled non-uniform angular color distribution. FIG. 1 also illustrates a device 120 used with the light source 100 with a lens 122 arrangement for reflecting the light from light source 100 to the device 120. The device 120 may be an application such as a flash type application or back lighting or other appropriate applications. The angular color non-uniformity of the light source 100 is configured to be used with a light based device 120 so that the overall system, i.e., light source 100 and device 120, becomes more efficient than a system that includes a conventional light source 100 with a uniform angular LED.

The LED 101 is illustrated as a flip-chip device with bond pads 102 located on the bottom surface of the LED 101. The bond pads 102 are bonded to contact elements 104 on a substrate 106, which may be, e.g., ceramic or silicon. The substrate 106 may be mounted on a heat sink 108 if desired. If desired, support structures other than the substrate 106 and heat sink 108 may be used.

In one embodiment, the LED 101 may be a blue or ultraviolet (UV) LED and may be a high radiance device, such as the type described in U.S. Ser. No. 10/652,348, entitled "Package for a Semiconductor Light Emitting Device", by Frank Wall et al., filed Aug. 29, 2003, Pub. No. 2005/0045901, having the same assignee as the present disclosure and which is incorporated herein by reference. The angular emission pattern of the LED 101 can be lambertian (as illustrated in FIG. 1) or controlled using a photonic crystals such as lattice structures.

Mounted to the LED 101 is a wavelength converting element 110 that may be, e.g., a phosphor in a binder material, embedded in, e.g., silicone and molded over the LED 101, or in a rigid ceramic slab, sometimes referred to herein as a "luminescent ceramic". The ceramic slabs are generally self-supporting layers and may be translucent or transparent to particular wavelengths, which may reduce the scattering loss associated with non-transparent wavelength converting layers such as conformal layers. Luminescent ceramic layers may be more robust than thin film or conformal phosphor layers.

Examples of phosphors that may be used in a binder, molded over the LED 101, or in a luminescent ceramic include aluminum garnet phosphors with the general formula $(Lu_{1-x-y-a-b}Y_xGd_y)_3(Al_{1-z}Ga_z)_5O_{12}:Ce_aPr_b$ wherein $0<x<1$, $0<y<1$, $0<z\leq0.1$, $0<a\leq0.2$ and $0<b\leq0.1$, such as $Lu_3Al_5O_{12}:Ce^{3+}$ and $Y_3Al_5O_{12}:Ce^{3+}$ which emit light in the yellow-green range; and $(Sr_{1-x-y}Ba_xCa_y)_{2-z}Si_{5-a}Al_aN_{8-a}O_a:$ $Eu_z^{2+}$ wherein $0 \leq a < 5$, $0 < x \leq 1$, $0 \leq y \leq 1$, and $0 < z \leq 1$ such as $Sr_2Si_5N_8:Eu^{2+}$, which emit light in the red range. Suitable $Y_3Al_5O_{12}:Ce^{3+}$ ceramic slabs may be purchased from Baikowski International Corporation of Charlotte, N.C. Other green, yellow, and red emitting phosphors may also be suitable, including $(Sr_{1-a-b}Ca_bBa_c)Si_xN_yO_z:Eu_a^{2+}$ (a=0.002-0.2, b=0.0-0.25, c=0.0-0.25, x=1.5-2.5, y=1.5-2.5, z=1.5-2.5) including, for example, $SrSi_2N_2O_2:Eu^{2+}$; $(Sr_{1-u-v-x}Mg_u$-$Ca_vBa_x)(Ga_{2-y-z}Al_yIn_z S_4):Eu^{2+}$ including, for example, $SrGa_2S_4:Eu^{2+}$; $Sr_{1-x}Ba_xSiO_4:Eu^{2+}$; and $(Ca_{1-x}Sr_x)S:Eu^{2+}$ wherein $0 < x \leq 1$ including, for example, $CaS:Eu^{2+}$ and $SrS:Eu^{2+}$. As illustrated by the respective arrows 114 and 115, the light source 100 has both top emission and side emission of light, where the top emitted light 114 is bluish white and the side emitted light 115 is yellowish. By controlling the height H of the wavelength converting element 110, or more specifically, the height/width (H/W) ratio, the angular dependency of the light can be controlled to produce a desired amount of bluish white light 114 and yellowish light 115 that is appropriate for the device 120. By way of example, to produce less blue light, a wavelength converting element 110 with greater height H is used, while to produce more blue light, a wavelength converting element 110 with less height H is used.

Figure 2A:
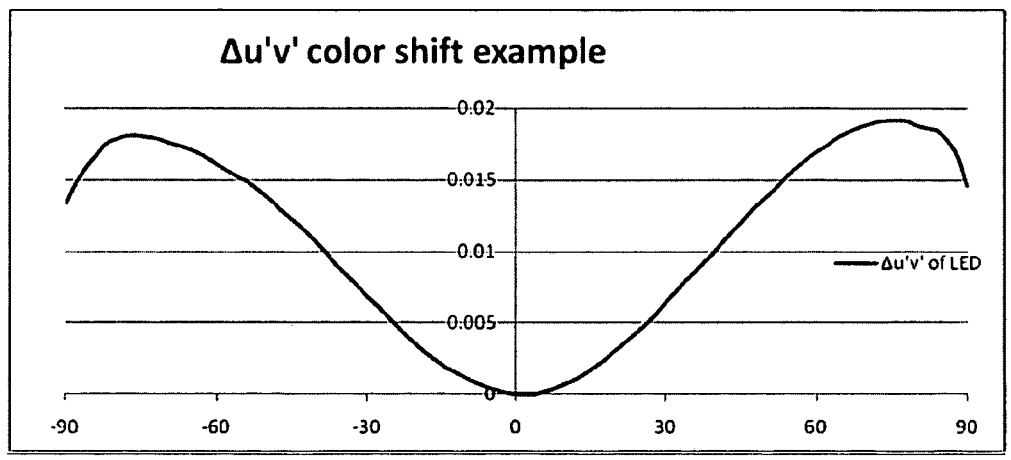
FIG. 2 illustrates a $\Delta u'v'$ shift over angle for showing the angular color non-uniformity of the light source from FIG. 1.
Figure 2B:
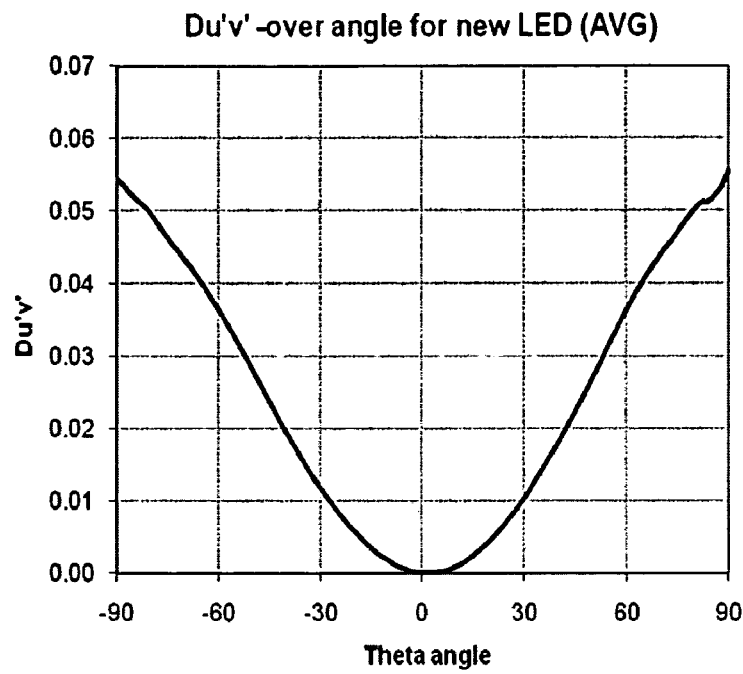

FIG. 2A illustrates a $\Delta u'v'$ shift over angle showing one embodiment of the angular color non-uniformity of the light source 100. The $\Delta u'v'$ shift over angle is a measure of the color shift relative to a reference point. As can be seen in FIG. 2A, the light source 100 produces a $\Delta u'v'$ shift of >0.015 between 0° and 90° with respect to the 0° reference point. This is the maximum color over angle variation as measured within the angular range. FIG. 2B shows an example of the $\Delta u'v'$ for another light source 100 with a blue LED and Red/Green phosphors, that has been configured to produce a $\Delta u'v' > 0.05$ over angle. By varying, e.g., the H/W ratio, different maximum $\Delta u'v'$ over angle values can be created e.g. maximum $\Delta u'v'$ over angle may be larger than 0.015, 0.03, 0.045 or 0.06 depending on the desired application, e.g., the device 120, the light source 100 is to be used with. The device 120 using the light source 100, in accordance with one embodiment, then produces a spatial color uniformity of $\Delta u'v'$ less than 0.015, e.g., less than 0.01 or 0.005.

Accordingly, rather than try to eliminate the angular color dependency of the light, the light source 100 is designed to produce a controlled angular color non-uniformity that is optimized for the particular device 120 with which the light source 100 is to be used. Thus, as described above for example, the light source 100 is configured to produces a controlled angular color non-uniformity with a $\Delta u'v'$ shift of >0.015 over angle, but when used with device 120, the device 120 produces a spatial color uniformity of $\Delta u'v' < 0.015$. Different spatial color uniformities like $\Delta u'v' < 0.05$ to $\Delta u'v' < 0.015$ are possible depending on the application requirements. For example, medical monitors or other application that require a highly accurate representation of color may be produced with a backlight in accordance with one embodiment having a $\Delta u'v' < 0.05$, whereas consumer monitors may be produced with a backlight having a $\Delta u'v' < 0.01$, and applications such as a camera flash may have a $\Delta u'v' < 0.015$. With the controlled angular color non-uniformity, the efficiency of the light source 100 can be increased as there is no need to block light from being emitted from the light source 100. Consequently, the overall performance of the system, including the device 120 and the light source 100 is improved compared to systems in which a uniform angular LED is used.

Figure 3A:
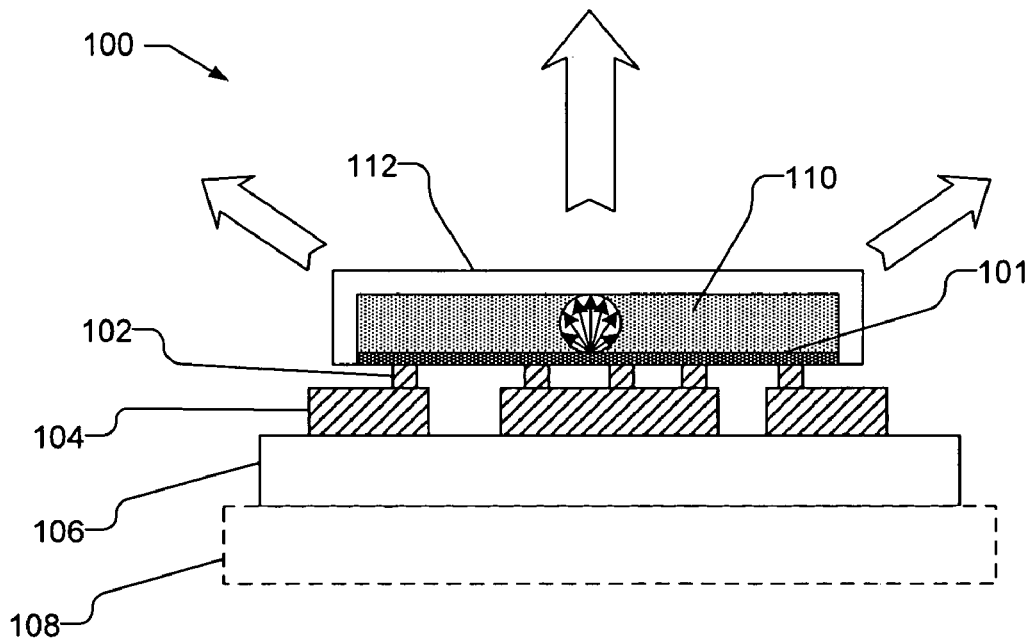
FIGS. 3A and 3B illustrates an example of the light source used with a flash type application.
Figure 3B:
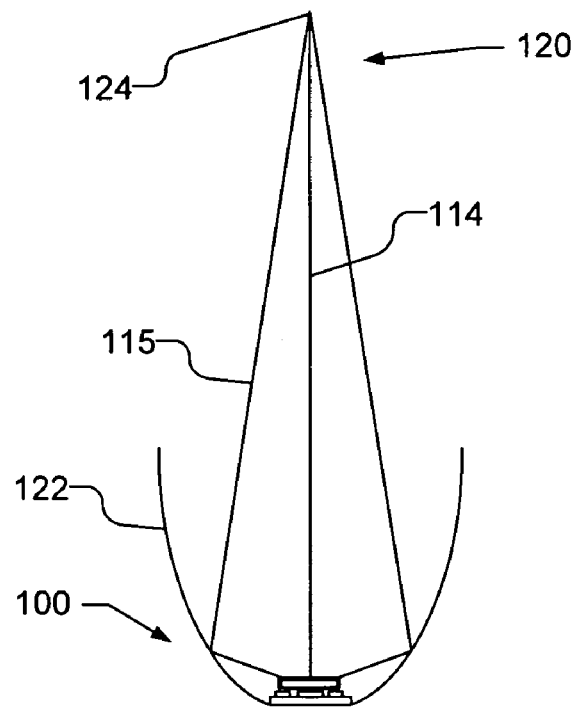

FIGS. 3A and 3B illustrates an example of the light source 100 that may be used with a flash type device 120, e.g., for a camera. FIG. 2B illustrates light source 100 with an additional controlling element 112, such as a dichroic filter, overlying the wavelength converting element 110. The dichroic filter 112 transmits light differently as a function of angle, which further aids in the control of the angular dependency. Alternatively, a scattering element may be used to appropriately reduce or control the angular dependency. As illustrated in FIG. 2B, the light source 100 produces bluish white light 114 and yellowish light 115 that is reflected by the reflector 122 and mixed at the imaging target 124.

Figure 4:
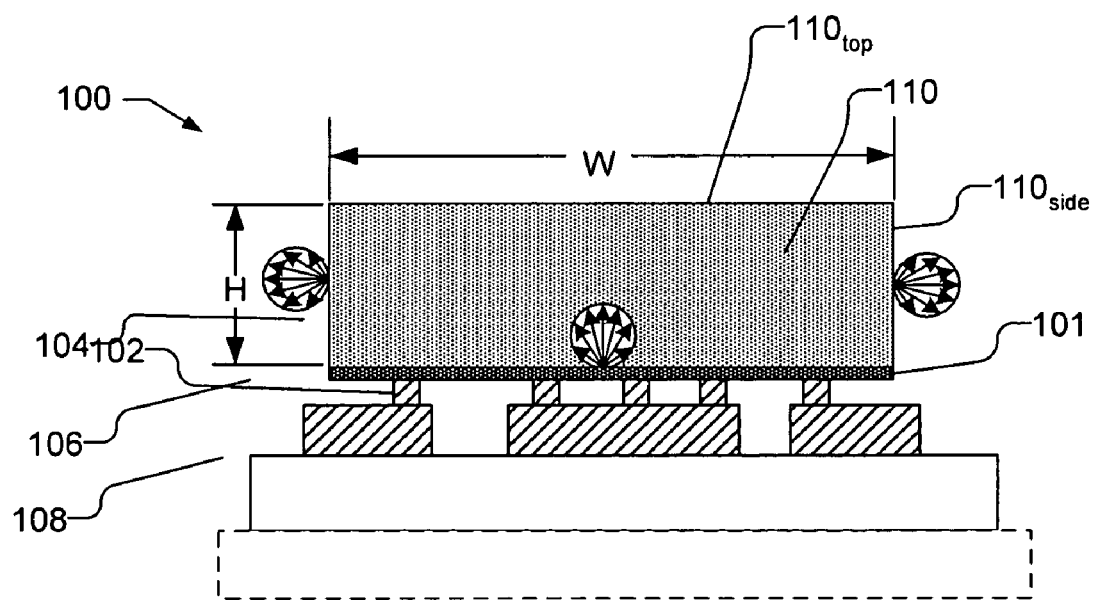
FIG. 4 illustrates a side view of the light source in a semi-side emitter configuration.

If desired, the light source 100 may be a side (or semi-side) emitter in which no there is little top emission and significant side emission. FIG. 4 illustrates light source 100 in a semi-side emitter configuration, in which no top reflector on the top surface $110_{top}$ of the wavelength converting element 110 is necessary. As illustrated in FIG. 4, the angular emission pattern from the sides $110_{side}$ of the light source 100 is lambertian. By replacing a top reflector with increased height H of the wavelength converting element 110 with respect to the width W of the wavelength converting element 110 (which in this embodiment is the same as the width of the LED 101), the number of reflections of the light to the LED 101 is reduced. Reflections to the LED 101 are inefficient and therefore by reducing the reflections to the LED 101 the losses in the system are reduced. Moreover, by increasing the height H, the sides $110_{side}$ of the wavelength converting element 110 have a greater area, which provides increased light extraction from the sides $110_{side}$ of the wavelength converting element 110. By increasing the height H of the wavelength converting element 110 with respect to the width W, the light source 100 is optimized for applications requiring light extraction, as opposed to light collection. For example, in applications such as flash optical design, a small designed source is desired, so that optics can be kept small, while collecting most of the light and aim the light at a target of 1.05×0.8 meters at 1 meter distance. By increasing the height of the wavelength converting element 110, the light extracted is increased. The Ce concentration within the wavelength converting element may be configured to produce the desired color point for the particular application. Additionally, scattering particles may be added to the wavelength converting element to assist in the light extraction into air.

Figure 5:
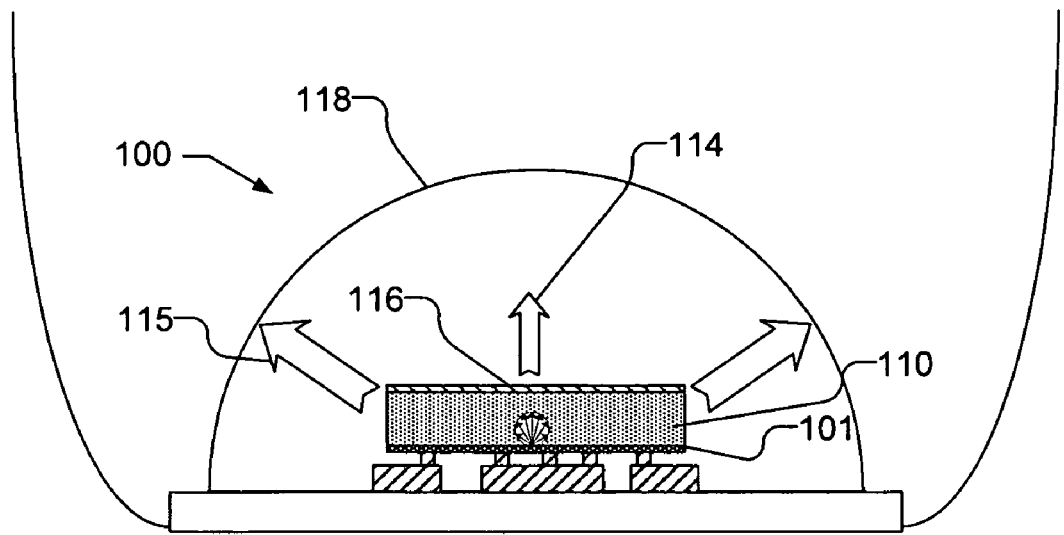
FIG. 5 illustrates another embodiment of the light source that emits light with a controlled non-uniform angular color dependency.

FIG. 5 illustrates another embodiment of the light source 100 that emits light with a controlled angular color dependency. The light source 100 includes a thin optically coupled laminate element 116 to the top surface of the wavelength converting element 110, which may be, e.g., a dichroic layer, a scattering layer, or a red phosphor layer. If desired, the element 116 may be placed between the wavelength converting element 110 and the LED 101, particularly when the element 116 is a red phosphor layer, the wavelength converting element 110 is a greenish phosphor plate such as LUAG, and the LED 101 is a blue LED. Additionally, the light source 100 may include an overmolded dome lens 118, which may be silicon, epoxy, or other appropriate material, which may also be to assist in the control of the angular color non-uniformity. If desired, the overmolded dome lens 118 need not be used. The top emitted light, illustrated by arrow 114, is bluish white and has a lambertian emission profile. The side emitted light, illustrated by arrow 115, is yellowish and has an isotropic emission profile that is configured by the height H of the wavelength converting element as well as by scattering. The angular dependent emission of light source 100 may be translated into a uniform spatial color distribution in the desired application, such a backlight.

Figures 6A, 6B:
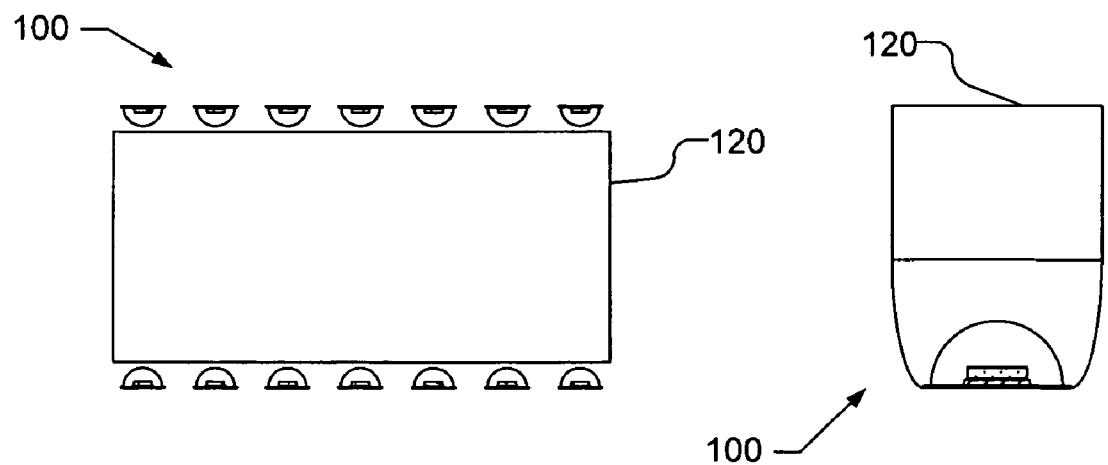
FIGS. 6A and 6B, by way of example, illustrate a plan view and side view of a plurality of light sources used with a backlight type application.
Figure 7:
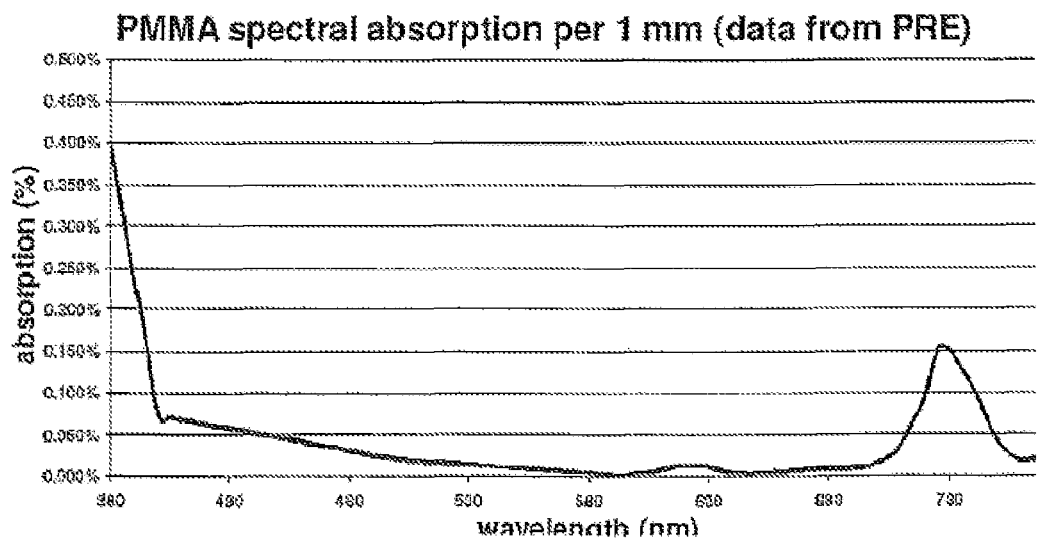
FIG. 7 is a graph illustrating the absorption curve per 1 mm for PMMA acrylic, which is commonly used as a waveguide in a backlight application.
Figure 8:
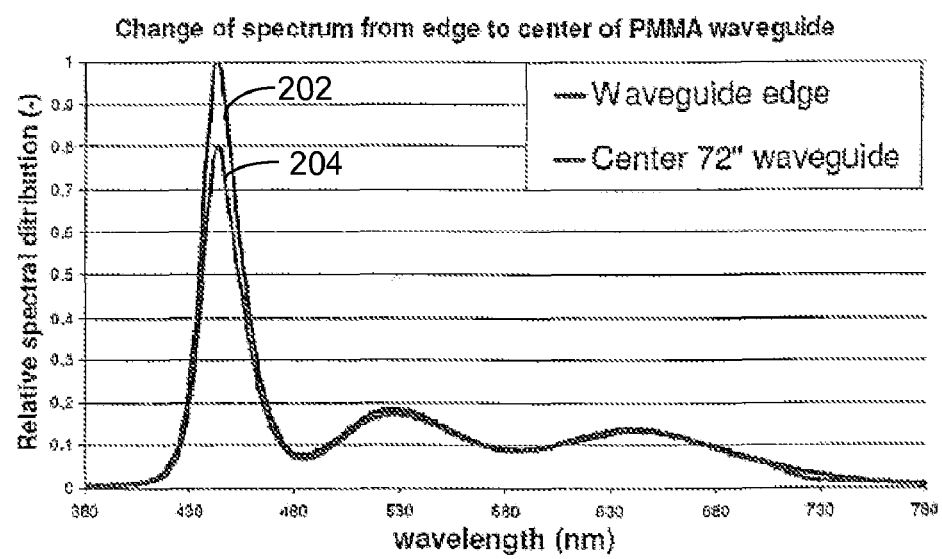
FIG. 8 is a graph illustrates the effect of the spectral absorption of the waveguide.

FIGS. 6A and 6B, by way of example, illustrate a plan view and side view of a plurality of light source 100 used with a backlight type device 120. The backlight 120 extracts color, e.g., blue versus green/red, from a single light source 100 at different locations within the backlight. Thus, by using a number of light sources 100 and by controlling the angular color distribution of the emitted light, a uniform spatial distribution of color may be produced within the backlight application FIG. 7 is a graph illustrating the absorption curve per 1 mm for PMMA acrylic, which is commonly used as a waveguide in a backlight application. The X axis represents wavelengths while the Y axis represents the percentage of absorption. FIG. 8 is a graph illustrates the effect of the spectral absorption of the waveguide illustrating the change of the spectrum from the edge (illustrated by curve 202) and the center (illustrated by curve 204) of a 72" PMMA waveguide. The X axis represents wavelengths while the Y axis represents relative spectral distribution. As can be seen in FIG. 8, the center 204 of the spectrum at the center of the waveguide includes less blue light than the edge 202 of the waveguide. FIG. 9 is a graph illustrating the theoretical color shift due to a PMMA waveguide's (blue) absorption in a 2-sided backlight over distance for a conventional light source having a uniform angular and spatial input. The X axis represents the diagonal position of the backlight in inches, while the Y axis represents the change in $\Delta u'v'$ from the center to the edge. As illustrated, the conventional waveguide using a conventional uniform angular light source has a $\Delta u'v'$ that is greater than 0.01 and in fact is up to 0.02.

Figure 10:
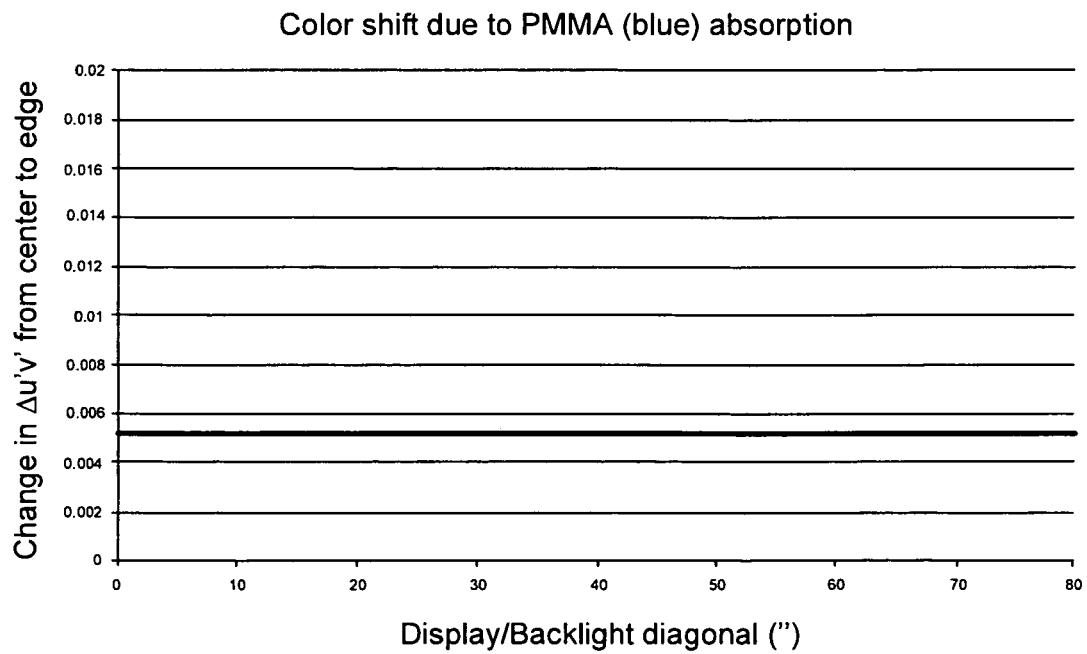
FIG. 10 is a graph illustrating at theoretical PMMA waveguide's absorption using a light source having a controlled angular color non-uniformity.

Thus, as can be seen from the graphs in FIGS. 7, 8, and 9, more blue light is absorbed over distance by a PMMA waveguide, with the result that such a waveguide has less blue light in the center of the waveguide than at the edge of the waveguide. Moreover, as illustrated in FIG. 9, the $\Delta u'v'$ shift has an approximately linear variation over distance. With the use of the controlled non-uniform angular color distribution of light source 100, more blue light can be emitted directly towards the center of the waveguide to compensate for the blue absorption in the PMMA material to produce a more uniform color distribution in the backlight application. By way of example, FIG. 10 illustrates a theoretical PMMA waveguide's absorption, similar to that shown in FIG. 9, but using a light source having a controlled angular color non-uniformity with a $\Delta u'v'$ shift of >0.01 over angle. As illustrated in FIG. 10, the resulting spatial color uniformity has a $\Delta u'v'$ of less than 0.01.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An apparatus comprising:
   a light source comprising:
   a light emitting diode;
   a wavelength converting element disposed over the light emitting diode, the wavelength converting element having a height and a width, wherein the ratio of height and width is selected to produce light with a desired non-uniform angular color distribution of $\Delta u'v'>0.015$ over a particular angle, such that the light is more bluish at a viewing angle of 0° than at a wider viewing angle; and
   a light receiving device coupled to receive light from the wavelength converting element, the light receiving device having non-uniform color absorption characteristics that at least partially compensate for the non-uniform angular color distribution of the wavelength converting element to create an angular color uniformity at an output of the light receiving device of $\Delta u'v'<0.01$ over the particular angle,
   wherein the light receiving device exhibits a percentage of absorption of blue light that is higher than a percentage of absorption of longer wavelength visible light.

2. The apparatus of claim 1, further comprising a lens for reflecting top emitted light and side emitted light from the wavelength converting element outwards from the light emitting diode, wherein the top emitted light and the side emitted light has the desired non-uniform angular color distribution.

3. The apparatus of claim 1, wherein the light receiving device is a backlight using a waveguide and wherein the apparatus further comprises a plurality of light sources.

4. The apparatus of claim 1, further comprising a laminate element coupled to the wavelength converting element.

5. The apparatus of claim 1, wherein the wavelength converting element comprises phosphor.

6. A method comprising:
   providing a light emitting diode;
   providing a wavelength converting element with a height and width ratio that is selected to produce a desired non-uniform angular color distribution in light emitted from the wavelength converting element with a uniformity of $\Delta u'v'>0.015$ within an angular distribution from 0° to 90°;
   coupling the wavelength converting element to the light emitting diode to produce a light source with the desired non-uniform angular color distribution; and
   coupling the light source with the desired non-uniform angular color distribution to a light receiving device coupled to receive light from the wavelength converting element, the light receiving device having non-uniform color absorption characteristics that at least partially compensate for the non-uniform angular color distribution of the wavelength converting element,
   wherein the light receiving device exhibits a percentage of absorption of blue light that is higher than a percentage of absorption of longer wavelength visible light.

7. The method of claim 6, further comprising translating the desired non-uniform angular color distribution from the light source into a uniform spatial color distribution in a light based application with a uniformity of $\Delta u'v'<0.015$.

8. The method of claim 7, wherein the light based application is a backlight application.

9. The method of claim 7, wherein the light based application is a flash application.

10. The apparatus of claim 1 wherein the particular angle is from 0° to 90°.

11. The apparatus of claim 1 wherein the light receiving device is a waveguide that exhibits a percentage of absorption of blue light that is higher than a percentage of absorption of longer wavelength visible light.

* * * * *